United States Patent
Hayashida et al.

(10) Patent No.: US 8,617,772 B2
(45) Date of Patent: *Dec. 31, 2013

(54) HOLOGRAM RECORDING MATERIAL AND HOLOGRAM RECORDING MEDIUM

(75) Inventors: Naoki Hayashida, Tokyo (JP); Atsuko Kosuda, Tokyo (JP); Jiro Yoshinari, Tokyo (JP)

(73) Assignee: TDK Corporation, Tokyo (JP)

( * ) Notice: Subject to any disclaimer, the term of this patent is extended or adjusted under 35 U.S.C. 154(b) by 418 days.

This patent is subject to a terminal disclaimer.

(21) Appl. No.: 12/556,965

(22) Filed: Sep. 10, 2009

(65) Prior Publication Data

US 2010/0086859 A1 Apr. 8, 2010

(30) Foreign Application Priority Data

Oct. 8, 2008 (JP) .................................. 2008-261325

(51) Int. Cl.
*G03H 1/02* (2006.01)

(52) U.S. Cl.
USPC ........................................ 430/2; 430/1; 359/3

(58) Field of Classification Search
None
See application file for complete search history.

(56) References Cited

U.S. PATENT DOCUMENTS

| | | | |
|---|---|---|---|
| 3,770,435 A * | 11/1973 | Volkert et al. | 430/307 |
| 4,144,073 A * | 3/1979 | Bronstert et al. | 430/288.1 |
| 5,217,846 A * | 6/1993 | Smothers | 430/281.1 |
| 6,268,089 B1 | 7/2001 | Chandross et al. | |
| 6,479,193 B1 | 11/2002 | Maeda et al. | |
| 6,524,771 B2 | 2/2003 | Maeda et al. | |
| 6,914,703 B2 | 7/2005 | Tomita et al. | |
| 7,767,361 B2 | 8/2010 | Mizushima | |
| 7,883,821 B2 | 2/2011 | Kosuda et al. | |
| 7,932,000 B2 | 4/2011 | Hayashida et al. | |
| 7,939,221 B2 | 5/2011 | Kosuda et al. | |
| 8,080,348 B2 * | 12/2011 | Hayashida et al. | 430/1 |
| 2002/0110740 A1 | 8/2002 | Otaki et al. | |
| 2004/0197670 A1 * | 10/2004 | Takeyama | 430/1 |
| 2004/0202942 A1 * | 10/2004 | Takeyama | 430/1 |

(Continued)

FOREIGN PATENT DOCUMENTS

| | | | |
|---|---|---|---|
| DE | 2251433 | * | 4/1974 |
| JP | 50-005104 | * | 1/1975 |

(Continued)

OTHER PUBLICATIONS

U.S. Appl. No. 13/107,281, filed May 13, 2011, Hayashida, et al.

(Continued)

*Primary Examiner* — Martin Angebranndt
(74) *Attorney, Agent, or Firm* — Oblon, Spivak, McClelland, Maier & Neustadt, L.L.P.

(57) ABSTRACT

The present invention provides a hologram recording material and a hologram recording medium, which are suitable for volume hologram record and can attain high refractive index change, flexibility, high sensitivity, low scattering, environment resistance, that is, storage stability, durability, low dimensional change (low shrinkage) and high multiplicity in holographic memory recording using not only a green laser but also a blue laser. A hologram recording material comprising: a radical photopolymerizable compound; and a matrix which is a dispersion medium for the radical photopolymerizable compound, wherein the radical photopolymerizable compound comprises a (meth)acrylamide derivative represented by the following general formula (I): $CH_2=CR^1-CONR^2-CH_2-O-R^3$ (I) wherein $R^1$ represents H or a $CH_3$ group, $R^2$ represents H or an organic group, and $R^3$ represents an organic group having 3 or more carbon atoms in total. A hologram recording medium 11 which has a hologram recording layer 21.

15 Claims, 2 Drawing Sheets

(56) References Cited

U.S. PATENT DOCUMENTS

| | | |
|---|---|---|
| 2006/0172203 A1 | 8/2006 | Mizushima |
| 2007/0042275 A1* | 2/2007 | Kamo ................. 430/1 |
| 2007/0111107 A1 | 5/2007 | Yoshinari et al. |
| 2007/0111108 A1 | 5/2007 | Hayashida et al. |
| 2007/0166625 A1* | 7/2007 | Cole et al. ............ 430/1 |
| 2007/0243473 A1 | 10/2007 | Mizushima et al. |
| 2007/0243474 A1 | 10/2007 | Mizushima et al. |
| 2008/0057404 A1 | 3/2008 | Kosuda et al. |
| 2008/0057405 A1 | 3/2008 | Yoshinari et al. |
| 2008/0057406 A1 | 3/2008 | Hayashida et al. |
| 2008/0076033 A1 | 3/2008 | Hayashida et al. |
| 2008/0145307 A1 | 6/2008 | Kosuda et al. |
| 2008/0160421 A1 | 7/2008 | Hayashida et al. |
| 2008/0193857 A1 | 8/2008 | Kosuda et al. |
| 2008/0254375 A1 | 10/2008 | Hayashida et al. |
| 2008/0268349 A1 | 10/2008 | Kosuda et al. |
| 2009/0051988 A1* | 2/2009 | Sasaki et al. .......... 359/3 |
| 2009/0091810 A1 | 4/2009 | Yoshinari et al. |
| 2009/0092904 A1 | 4/2009 | Hayashida et al. |
| 2009/0097085 A1 | 4/2009 | Hayashida et al. |
| 2009/0186281 A1 | 7/2009 | Kosuda et al. |

FOREIGN PATENT DOCUMENTS

| | | | |
|---|---|---|---|
| JP | 50-035280 | * | 4/1975 |
| JP | 57-124730 | * | 8/1982 |
| JP | 03-106903 | * | 5/1991 |
| JP | 5-46063 A | | 2/1993 |
| JP | 6-148880 | | 5/1994 |
| JP | 2953200 | | 7/1999 |
| JP | 11-344917 | | 12/1999 |
| JP | 2001-281429 A | | 10/2001 |
| JP | 2002-236439 | | 8/2002 |
| JP | 2002-236440 | | 8/2002 |
| JP | 2003-43903 | | 2/2003 |
| JP | 2005-77740 | | 3/2005 |
| JP | 2005-99612 | | 4/2005 |
| JP | 2005-321674 | | 11/2005 |
| JP | 2006-225446 | | 8/2006 |

OTHER PUBLICATIONS

Office Action issued Jun. 11, 2013, in Japanese Patent Application No. 2009-190531.

* cited by examiner

HOLOGRAM RECORDING MATERIAL AND HOLOGRAM RECORDING MEDIUM

BACKGROUND OF THE INVENTION

1. Field of the Invention

The present invention relates to a hologram recording material suitable for volume hologram recording, and a hologram recording medium having a hologram recording layer made of the hologram recording material.

2. Disclosure of the Related Art

Research and development of holographic memories have been advanced as recording technique making it possible to attain large-capacity recording and high-speed data transmission. Examples of the property required for a hologram recording material include high refractive index change at the time of recording, high sensitivity, low scattering, environment resistance, that is, storage stability, durability, low dimension change, high multiplicity, and the like.

As a hologram recording material, attention has been paid to an organic-inorganic hybrid material, which is made mainly of an inorganic matrix and a photopolymerizable monomer, and the hybrid material has been investigated. The inorganic matrix is excellent in environment resistance and durability.

For example, Japanese Patent No. 2953200 (Patent Document 1) discloses an optical recording film wherein a photopolymerizable monomer or oligomer and a photopolymerization initiator are contained in an inorganic substance network film. As the photopolymerizable monomer, disclosed is a monofunctional (meth)acrylic acid ester, a polyfunctional (meth)acrylic acid ester, or the like (paragraph [0017]).

JP-A-11-344917 (Patent Document 2) discloses an optical recording medium wherein an organic-inorganic hybrid matrix contains therein a photoactive monomer. As the photoactive monomer, disclosed is an acrylic acid ester monomer such as diethylene glycol monoethyl ether acrylate (paragraph [0018]).

JP-A-2002-236439 (Patent Document 3) discloses a hologram recording material comprising: a matrix made of an organic-inorganic hybrid polymer obtained by copolymerizing an organometallic compound containing an ethylenically unsaturated double bond and an organic monomer having an ethylenically unsaturated double bond, as main chain constituting components, and/or a hydrolytic polycondensate thereof; a photopolymerizable compound; and a photopolymerization initiator. As the photopolymerizable compound, a radical photopolymerizable compound or a cation photopolymerizable compound is described (paragraph [0041]); and as the radical photopolymerizable compound, a (meth)acrylic acid ester monomer is disclosed (paragraphs [0042] to [0043]).

JP-A-2005-77740 (Patent Document 4) discloses a hologram recording material comprising metal oxide particles, a polymerizable monomer, and a photopolymerization initiator. As the polymerizable monomer, a (meth)acrylic acid ester monomer is disclosed (paragraph [0020]).

JP-A-2005-99612 (Patent Document 5) discloses a hologram recording material comprising a compound having one or more polymerizable functional groups, a photopolymerization initiator, and colloidal silica particles. As one species of the polymerizable functional groups, an acrylic acid ester monomer is disclosed (paragraphs [0019] to [0022]). As a different example thereof, an acrylamide (for example, ethylenebisacrylamide) is disclosed (paragraph [0023]).

JP-A-2005-321674 (Patent Document 6) discloses a hologram recording material comprising: an organometallic compound at least containing at least two kinds of metals (Si and Ti), oxygen, and an aromatic group, and having an organometallic unit wherein two aromatic groups are directly bonded to one metal (Si); and a photopolymerizable compound. As the photopolymerizable compound, a radical polymerizable compound or a cation polymerizable compound is described (paragraph [0039]); and as the radical polymerizable compound, a (meth)acrylic acid ester is disclosed (paragraph [0041]).

Patent Document 1: Japanese Patent No. 2953200
Patent Document 2: JP-A-11-344917
Patent Document 3: JP-A-2002-236439
Patent Document 4: JP-A-2005-77740
Patent Document 5: JP-A-2005-99612
Patent Document 6: JP-A-2005-321674
Patent Document 7: JP-A-2006-225446

SUMMARY OF THE INVENTION

In the above Patent Documents 1 to 6, a (meth)acrylic acid ester is disclosed as a photopolymerizable monomer. However, the (meth)acrylic acid ester is easily hydrolyzed under an acidic condition or a basic condition. Moreover, the (meth)acrylic acid ester is easily subjected to transesterification reaction by interaction between the ester and a metal alkoxide compound or an oligomer thereof which is a material for forming a metal oxide matrix. Accordingly, when the (meth)acrylic acid ester is used as a photopolymerizable monomer in a metal oxide matrix, the (meth)acrylic acid ester is gradually decomposed so as to deteriorate the hologram recording property.

In the above Patent Document 5, the acrylamide (for example, ethylenebisacrylamide) is exemplified as the photopolymerizable monomer. However, ethylenebisacrylamide is low in hydrophilicity, and therefore, is not evenly dispersed in a metal oxide matrix.

Further, when the (meth)acrylic acid ester or ethylenebisacrylamide disclosed in the above Patent Documents 1 to 6 is used as the photopolymerizable monomer, the hologram recording material shrinks by the polymerization of the photopolymerizable monomer at the time of light exposure for hologram recording and/or postcure (postcuring). The postcure is light exposure performed in order to cause a remaining unreacted monomer component to react after light exposure for recording. If the hologram recording material largely shrinks, a bad effect is produced onto the reproduction of recorded information.

Any of the above Patent Documents 1 to 6 disclose holographic memory recording using a green laser, but do not disclose holographic memory recording using a blue laser.

As the wavelength of a recording/reproducing laser is shorter, any hologram recording layer is required to have a higher mechanical strength, a higher flexibility, a higher homogeneity, and environment resistance (that is, storage stability) thereof. If the mechanical strength of the hologram recording layer is insufficient, an increase in shrinkage of the layer at the time of recording, or a fall in the storage reliability is caused. In particular, in order to obtain a sufficient contrast based on refractive index modulation by means of a recording/reproducing laser having a wavelength in the short wavelength region, it is preferred to make the microscopic mechanical strength high up to some degree, and restrain monomer-migration and dark reaction after the light exposure for recording. If the flexibility of the hologram recording layer is insufficient, the migration of the photopolymerizable monomer in the layer is hindered in recording so that the sensitivity falls. If the homogeneity is insufficient, scattering is caused at the time of recording/reproducing. Thus, the reliability of the recording/reproducing itself deteriorates. An effect of the scattering based on the insufficient homogeneity of the recording layer becomes remarkable more easily in the case of a recording/reproducing laser having a wavelength in the short wavelength region.

An object of the present invention is to provide a hologram recording material and a hologram recording medium, which are suitable for volume hologram recording and can attain high refractive index change, flexibility, high sensitivity, low scattering, environment resistance, that is, storage stability, durability, low dimensional change (low shrinkage) and high multiplicity in holographic memory recording using not only a green laser but also a blue laser.

The present inventors have made eager investigations to find out that when a (meth)acrylamide derivative having a specific structure is used as a photopolymerizable monomer for a hologram recording material, the shrinkage of the recording material can be restrained very much at the time of light exposure for hologram recording and/or postcure (postcuring).

The present invention includes the followings:

(1) A hologram recording material comprising:
a radical photopolymerizable compound; and
a matrix which is a dispersion medium for the radical photopolymerizable compound,
wherein the radical photopolymerizable compound comprises a (meth)acrylamide derivative represented by the following general formula (I):

$$CH_2=CR^1-CONR^2-CH_2-O-R^3 \quad (I)$$

wherein $R^1$ represents H or a $CH_3$ group, $R^2$ represents H or an organic group, and $R^3$ represents an organic group having 3 or more carbon atoms in total.

(2) The hologram recording material according to the above-described (1), wherein the number of radical polymerizable C=C double bonds having a structure of $[CH_2=CR^1-CONR^2-CH_2-O-]$ in the (meth)acrylamide derivative represented by the general formula (I) is at least 30% with respect to the total number of radical polymerizable C=C double bonds in the whole of the radical photopolymerizable compound(s) contained in the hologram recording material.

(3) The hologram recording material according to the above-described (1) or (2), wherein $R^2$ and/or $R^3$ in the general formula (I) have/has a polyalkylene glycol unit represented by the following formula:

—(RO)$n$- wherein R represents a lower alkylene group having 1 to 4 carbon atoms, and n represents the number of repeating units of alkylene oxide.

(4) The hologram recording material according to the above-described (3), wherein $R^2$ and/or $R^3$ in the general formula (I) have/has a polyethylene glycol unit represented by the following formula:

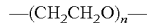
—(CH$_2$CH$_2$O)$_n$— wherein n represents the number of repeating units of ethylene oxide.

(5) The hologram recording material according to the above-described (3) or (4), wherein the number of the repeating units is 3 or more.

(6) The hologram recording material according to any one of the above-described (1) to (5), which further comprises a photopolymerization initiator.

(7) The hologram recording material according to any one of the above-described (1) to (6), wherein the matrix is an organometallic matrix formed from a matrix-forming material containing a metal alkoxide compound and/or an oligomer thereof.

(8) The hologram recording material according to the above-described (7), wherein the organometallic matrix is formed from a matrix-forming material containing a Si alkoxide compound and/or an oligomer thereof.

(9) The hologram recording material according to the above-described (7) or (8), wherein the organometallic matrix is formed from a matrix-forming material containing:
a Si alkoxide compound and/or an oligomer thereof; and
at least one metal alkoxide compound selected from the group consisting of a Ti alkoxide compound, a Zr alkoxide compound, a Ta alkoxide compound, a Sn alkoxide compound, a Zn alkoxide compound, and an Al alkoxide compound, and/or an oligomer of the metal alkoxide compound.

(10) A hologram recording medium which has a hologram recording layer comprising the hologram recording material according to any one of the above-described (1) to (9).

(11) The hologram recording medium according to the above-described (10), wherein the hologram recording layer has a thickness of at least 100 μm.

(12) The hologram recording medium according to the above-described (10) or (11), wherein recording/reproduction of said hologram recording medium are performed using a laser light having a wavelength of 350 to 450 nm.

The hologram recording material of the present invention comprises, as a photopolymerizable monomer, a (meth)acrylamide derivative having a specific structure, which is represented by the above general formula (I).

The photopolymerizable compound having the specific structure has, as a radical photoreactive group, a (meth)acrylamide group which is stable against hydrolysis. Therefore, the photopolymerizable compound is stable at either of a stage when a hologram recording layer is formed (stage when a matrix as a dispersion medium is formed) and a stage when the hologram recording medium is stored after the recording medium is produced and before the recording medium is exposed to light for recording. For this reason, desired hologram recording property is obtained. Furthermore, the polymer produced from the photopolymerizable compound is also stable at the storage stage after the light exposure for recording. Thus, desired reproducing property is obtained.

The use of the (meth)acrylamide derivative having the specific structure specifically causes restraint of shrinkage of the hologram recording material at the time of light exposure for hologram recording and/or postcure (postcuring). The mechanism for restraining the recording shrinkage specifically is unclear; however, the restraint would be based on the following mechanism: in the light exposure for hologram recording and/or postcure (postcuring), it appears that the (meth)acrylamide derivative having the specific structure easily undergoes not only a radical photopolymerization reaction but also a cleavage reaction into two molecules on the basis of irradiation with the light. As a result, the free volume increases. The increase in the free volume compensates for the polymerization shrinkage (recording shrinkage) based on the radical photopolymerization reaction. As a result, the shrinkage of the hologram recording material at the time of the light exposure for hologram recording and/or the postcure (postcuring) is restrained very much.

In such a manner, the hologram recording medium using the hologram recording material of the present invention can give a sufficient sensitivity and a sufficient refractive index modulation when the medium undergoes recording/reproduction with a blue laser as well as a green laser. The recording medium is also excellent in storage stability after the recording. Thus, the recording medium is high in recording/reproduction reliability.

DETAILED DESCRIPTION OF THE INVENTION

Figure 1:
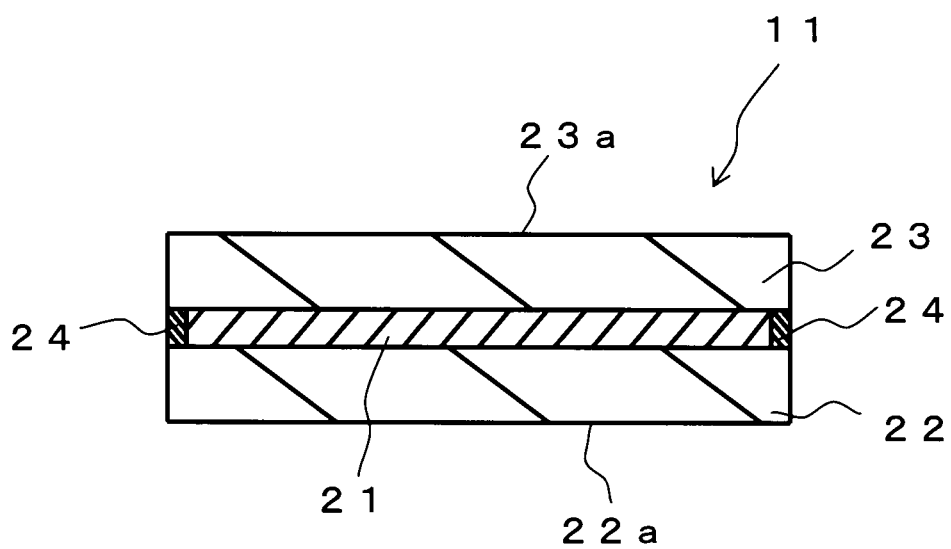
FIG. 1 is a view illustrating a schematic cross section of a hologram recording medium produced in the examples.

The hologram recording material of the present invention is a composition comprising a radical photopolymerizable compound (monomer), and a matrix which is a dispersion medium for the radical photopolymerizable compound. The hologram recording medium of the present invention has a hologram recording layer comprising the hologram recording material. In the present specification, a hologram recording layer may be referred to as a hologram recording material layer.

The matrix material is not particularly limited as far as it is a material for dispersing a radical photopolymerizable compound, and may be, for example, a material known in hologram recording materials. The material is preferably an organometallic matrix wherein a radical photopolymerizable compound can be evenly dispersed, as described below.

The organometallic matrix may be formed by a sol-gel reaction (that is, hydrolysis/polycondensation) from a matrix-forming material containing a metal alkoxide compound and/or an oligomer thereof (partially hydrolytic condensate). The matrix is composed of organometallic compound fine particles in a gel or sol form. The organometallic matrix functions as a dispersion medium for the photopolymerizable compound in the hologram recording material layer. In other words, the photopolymerizable compound in a liquid phase is evenly dispersed with good compatibility in the gel- or sol-form organometallic matrix.

When light having coherency is irradiated onto the hologram recording material layer, the radical photopolymerizable compound (monomer) undergoes polymerization reaction in the exposed portion so as to be polymerized, and further the photopolymerizable organic compound diffuses and migrates from the unexposed portion into the exposed portion so that the polymerization of the exposed portion further advances. As a result, an area where the polymer produced from the photopolymerizable organic compound is large in amount and an area where the polymer is small in amount are formed in accordance with the intensity distribution of the light. At this time, the organometallic compound fine particles migrate from the area where the polymer is large in amount to the area where the polymer is small in amount, so that the area where the polymer is large in amount becomes an area where the fine particles are small in amount, and the area where the polymer is small in amount becomes an area where the fine particles are large in amount. In this way, the light exposure causes the formation of the area where the polymer is large in amount and the area where the organometallic compound fine particles are large in amount. When a refractive index difference exists between the polymer and the fine particles, a refractive index change is recorded in accordance with the light intensity distribution.

In order to obtain a better recording property in the hologram recording material, it is necessary that a difference is large between the refractive index of the polymer produced from the photopolymerizable compound and that of the organometallic compound fine particles. The refractive indices of the polymer and the fine particles may be designed so as to make any one of the refractive indices high (or low).

When the organometallic compound fine particles are prepared to have a lower refractive index than that of the polymer produced from the photopolymerizable compound in the design of the hologram recording material, it is advisable to use Si at a relatively large content by percentage. On the other hand, when the organometallic compound fine particles are prepared to have a higher refractive index than that of the polymer produced from the photopolymerizable compound, it is advisable to use Ti, Zr, Ta, Sn, Zn, Al or the like at a relatively large content by percentage.

As described above, the organometallic matrix may be formed from a matrix-forming material which contains a Si alkoxide compound and/or an oligomer (that is, partially hydrolytic condensate) thereof. Further, the organometallic matrix may be formed from a matrix-forming material which contains, besides the Si alkoxide compound and/or the oligomer thereof, at least one metal alkoxide compound selected from the group consisting of a Ti alkoxide compound, a Zr alkoxide compound, a Ta alkoxide compound, a Sn alkoxide compound, a Zn alkoxide compound, and an Al alkoxide compound, and/or an oligomer (that is, partially hydrolytic condensate) of the metal alkoxide compound.

The metal alkoxide compound as the matrix-forming material is represented by the following general formula:

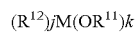

$$(R^{12})_j M(OR^{11})_k$$

wherein $R^{12}$ represents an alkyl group or an aryl group, $R^{11}$ represents an alkyl group, M represents a metal, j represents 0, 1, 2 or 3, and k represents an integer of 1 or more, provided that j+k is equal to the valence of the metal M; and when $R^{12}$s are present in accordance with j, $R^{12}$s may be different or the same, and when $R^{11}$s are present in accordance with k, $R^{11}$s may be different or the same. However, as at least one metal alkoxide compound, by using a metal alkoxide compound wherein j is 1, 2, or 3 in the above general formula, a metal-carbon (M-C) direct bond is introduced into the organometallic compound fine particles.

The alkyl group represented by $R^{12}$ is usually a lower alkyl group having about 1 to 4 carbon atoms. Examples thereof include methyl, ethyl, n-propyl, isopropyl, n-butyl, isobutyl, and sec-butyl groups, and the like. An example of the aryl group represented by $R^{12}$ is a phenyl group. The alkyl group and the aryl group may each have a substituent.

The alkyl group represented by $R^{11}$ is usually a lower alkyl group having about 1 to 4 carbon atoms. Examples thereof include methyl, ethyl, n-propyl, isopropyl, n-butyl, isobutyl, and sec-butyl, tert-butyl groups, and the like. The alkyl group may have a substituent.

Examples of the metal atom represented by M include Si, Ti, Zr, Ta, Sn, Zn, and Al. Other examples thereof include Ge and the like. In the present invention, it is preferred to use at least two metal alkoxide compounds represented by the above-described general formula containing Ms different from each other, and it is preferred that one of two Ms is Si and the other metal M, which is different from Si, is selected from the group consisting of Ti, Zr, Ta, Sn, Zn and Al. Examples of combination of the two metals include a combination of Si and Ti, that of Si and Ta, and that of Si and Zr. Of course, three metals may be combined with each other. The incorporation of the two or more metals as constituent elements into the matrix makes it easy to control property of the organometallic matrix, such as the refractive index thereof; thus, the incorporation is preferred for the design of the recording material.

Specific examples of the alkoxide compound (the above-described general formula) wherein M is Si include tetramethoxysilane, tetraethoxysilane, and tetrapropoxysilane, in each of which j=0 and k=4; methyltrimethoxysilane, ethyltrimethoxysilane, propyltrimethoxysilane, methyltriethoxysilane, ethyltriethoxysilane, propyltriethoxysilane, γ-mercaptopropyltrimethoxysilane, γ-mercaptopropyltriethoxysilane, γ-aminopropyltrimethoxysilane, γ-aminopropyltriethoxysilane, phenyltrimethoxysilane, phenyltriethoxysilane, and phenyltripropoxysilane, in each of which j=1, and k=3; dimethyldimethoxysilane, dimethyldiethoxysilane, diphenyldimethoxysilane, and diphenyldiethoxysilane, in each of which j=2, and k=2; and the like.

Of these silicon compounds, preferred are, for example, tetramethoxysilane, tetraethoxysilane, methyltrimethoxysilane, ethyltrimethoxysilane, methyltriethoxysilane, ethyltriethoxysilane, and the like.

Furthermore, diphenyldimethoxysilane is preferred. When an organometallic unit wherein two phenyl groups (Phs) are bonded directly to one Si atom (Ph-Si-Ph) is incorporated into an organometallic matrix, the flexibility of the organometallic matrix is improved and further the compatibility thereof with the radical photopolymerizable compound, which will be detailed later, or an organic polymer produced by the polymerization of the compound becomes good. Thus, the incorporation of the organometallic unit is preferred. Moreover, the refractive index of the organometallic compound also becomes high. The diphenylalkoxide compound of Si is easily available as a starting material, and has good reactivity in hydrolysis and polymerization. The phenyl groups may each have a substituent.

When a monoalkoxysilane (j=3 and k=1) such as trimethylmethoxysilane is present, the polymerization reaction is stopped; thus, the monoalkoxysilane can be used to adjust the molecular weight.

The alkoxide compound (the above-described general formula) of a metal M other than Si is not particularly limited, and specific examples thereof include alkoxide compounds of titanium such as tetra-n-propoxytitanium [Ti(O-nPr)$_4$], tetraisopropoxytitanium [Ti(O-iPr)$_4$], and tetra-n-butoxytitanium [Ti(O-nBu)$_4$]; alkoxide compounds of tantalum such as pentaethoxytantalum [Ta(OEt)$_5$], and tetraethoxytantalum pentanedionate [Ta(OEt)$_4$(C$_5$H$_7$O$_2$)]; alkoxide compounds of zirconium such as tetra-t-butoxyzirconium [Zr(O-tBu)$_4$], and tetra-n-butoxyzirconium [Zr(O-nBu)$_4$]; alkoxide compounds of tin such as tetra-t-butoxytin [Sn(O-tBu)$_4$], and tetra-n-butoxytin [Sn(O-nBu)$_4$]; alkoxide compounds of zinc such as diethoxyzinc [Zn(OEt)$_2$], and dimethoxyethoxyzinc [Zn(OC$_2$H$_4$—OCH$_3$)$_2$]; alkoxide compounds of aluminum such as tri-i-propoxyaluminum [Al(O-iPr)$_3$], tri-t-butoxyaluminum [Al(O-tBu)$_3$], tri-s-butoxyaluminum [Al(O-sBu)$_3$], tri-n-butoxyaluminum [Al(O-nBu)$_3$]. Metal alkoxide compounds besides these examples may be used.

An oligomer of the metal alkoxide compound (the above-described general formula) (corresponding to a partially hydrolytic condensate of the metal alkoxide compound) may be used. For example, a titaniumbutoxide oligomer (corresponding to a partially hydrolytic condensate of tetrabutoxytitanium) may be used. The metal alkoxide compound (the above-described general formula) and the oligomer of the metal alkoxide compound may be used together.

The organometallic matrix may contain trace amounts of elements other than the above.

The hologram recording material of the present invention comprises, as the radical photopolymerizable compound, a (meth)acrylamide derivative represented by the following general formula (I):

$$CH_2=CR^1—CONR^2—CH_2—O—R^3 \qquad (I)$$

wherein R$^1$ represents H or a CH$_3$ group, R$^2$ represents H or an organic group, and R$^3$ represents an organic group having 3 or more carbon atoms in total. The wording "(meth)acrylamide" is a wording for expressing methacrylamide and acrylamide collectively.

The radical photopolymerizable compound having the specific structure has an N-methylene oxide unit which is [—NR$^2$—CH$_2$—O—]. At the time of light exposure for hologram recording and/or postcure (postcuring), the N-methylene oxide unit easily causes a cleavage reaction represented by the following reaction scheme as well as a radical photopolymerization reaction in which C=C double bonds participate. It appears that the cleavage reaction is caused through a radical cleavage (homolysis) mechanism, which is induced directly and/or indirectly (for example, through a coexisting photopolymerization initiator or the like) by irradiation of the compound with light. In the reaction scheme, a case where R$^1$ is H is illustrated.

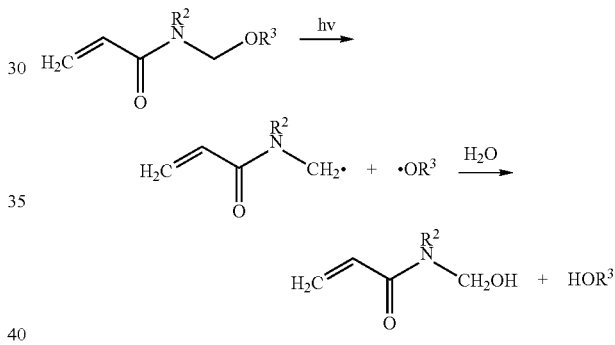

When the cleavage reaction is caused, two molecules of a molecule CH$_2$=CR$^1$—CONR$^2$CH$_2$OH and a molecule HOR$^3$ are produced from a single molecule of the radical photopolymerizable compound having the specific structure, so that the free volume increases. When the hologram recording material undergoes light exposure for hologram recording and/or postcure, the molecule CH$_2$=CR$^1$—CONR$^2$—CH$_2$—O—R$^3$ and/or the molecule CH$_2$=CR$^1$—CONR$^2$CH$_2$OH are/is polymerized by a radical photopolymerization reaction. Thus, the volume of the hologram recording material decreases so that the material is subjected to polymerization shrinkage (recording shrinkage). The above increase in the free volume compensates for the polymerization shrinkage. As a result, the shrinkage of the hologram recording material is restrained very much in the light exposure for hologram recording and/or the postcure.

The ease of the occurrence of the radical photo-cleavage reaction represented by the above reaction scheme would depend on the stability of a carbon radical [CH$_2$=CR$^1$—CONR$^2$—CH$_2$·], which is generated as an intermediate. As shown in (A) illustrated below, in this intermediate radical, an electron of the carbon radical is stabilized by a lone electron pair of the nitrogen atom adjacent thereto. Thus, the radical would be able to exist more stably. For this reason, the radical photopolymerizable compound having the specific structure, which has the N-monomethylene oxide unit of [—NR$^2$—

CH$_2$—O—] (i.e. the number of methylene carbon atom: 1), easily undergoes a radical photo-cleavage reaction.

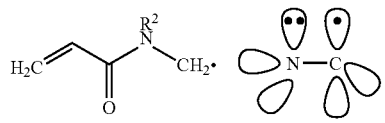

(A) an Intermediate Radical when the Number of Methylene Carbon Atom is 1

In the meantime, in the case of an N-dimethylene oxide unit (i.e. the number of methylene carbon atoms: 2), an intermediate carbon radical therefrom is not stabilized by a lone electron pair of the nitrogen atom, as shown in (B) illustrated below. Therefore, this carbon radical is not easily produced as an intermediate. As a result, when the number of the methylene carbon atoms is 2 or more, a radical photo-cleavage reaction does not advance, or advances very slightly.

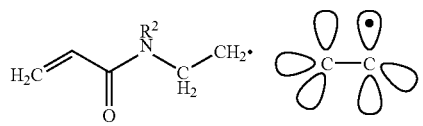

(B) an Intermediate Radical when the Number of Methylene Carbon Atoms is 2

In the general formula (I), R$^2$ represents H or an organic group. The organic group represented by R$^2$ is not particularly limited, and may be a linear or branched organic group, or a cyclic organic group. The organic group may contain any substituent and/or any hetero atom (such as N or O).

R$^2$ may be an organic group represented by:

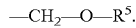

R$^5$ may be a linear or branched organic group, or a cyclic organic group. R$^5$ may contain any substituent and/or any hetero atom (such as N or O). In a case where R$^2$, which is bonded to the N atom, forms the N-monomethylene oxide unit of [—N—CH$_2$—O—] as described above, a molecule HOR$^5$ is further produced by a cleavage reaction when the hologram recording material undergoes light exposure for hologram recording and/or postcure. As a result, the free volume further increases. Thus, the case is preferred from the viewpoint of restraint of the shrinkage of the hologram recording material.

In the general formula (I), R$^3$ represents an organic group having 3 or more carbon atoms in total. The organic group, which is represented by R$^3$ and has 3 or more carbon atoms in total, is not particularly limited, and may be a linear or branched organic group, or a cyclic organic group. The organic group may contain any substituent and/or any hetero atom (such as N or O).

R$^2$ or R$^3$ may further have a (meth)acrylamide N-methyl ether group. Additionally, R$^2$ or R$^3$ may have any radical polymerizable carbon-carbon double bond as in a (meth) acrylamide group other than the above, a (meth)acrylic acid ester group, a vinyl ether, or the like. For example, when it is feared that free R$^3$ produces a bad effect onto the stability of recorded signals over time, it is preferred to introduce, into R$^3$, a radical polymerizable carbon-carbon double bond (having no photo-cleavage property) other than that in the (meth) acrylamide N-methyl ether group.

In the general formula (I), preferably, R$^2$ and/or R$^3$ are/is a group having a polyalkylene glycol unit represented by the following formula:

wherein Rs each represent a lower alkylene group having 1 to 4 carbon atoms, and n represents the number of repeating units (weight-average polymerization degree) of the alkylene oxide.

Specific examples of the lower alkylene group represented by R include methylene, ethylene, 1,3-propylene, 1,2-propylene, 1,4-butylene, and 1,3-butylene groups. Of these groups, an ethylene group and a 1,3-propylene group are suitable from the viewpoint of hydrophilicity, and an ethylene group is preferred. In other words, R$^2$ and/or R$^3$ are/is preferably a group having a polyethylene glycol unit:

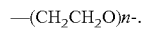

The number of the repeating units n is preferably 3 or more, more preferably 4 or more and 50 or less, even more preferably 5 or more and 30 or less from the viewpoint of hydrophilicity, and restraint of the recording shrinkage.

When the (meth)acrylamide derivative of the general formula (I) has a polyalkylene glycol unit, which is hydrophilic, the derivative is good in compatibility with all of the organometallic matrix, a metal alkoxide compound at the stage of the formation of the matrix, and an oligomer that is a partially condensate of the alkoxide. Thus, the derivative is more evenly dispersed in the organometallic matrix.

It is advisable to design the molecule of the (meth)acrylamide derivative of the general formula (I) in accordance with the above-mentioned cleavage reaction mechanism, considering the compatibility thereof with the matrix material, recording properties (such as a dynamic range), the storage stability, the difficulty of the synthesis of the compound, and others.

As the radical photopolymerizable compound, one kind of the (meth)acrylamide derivative having the above-mentioned specific structure may be used, or two or more kinds thereof may be used together.

When the (meth)acrylamide derivative having the specific structure is a derivative having in the molecule thereof a single (meth)acrylamide group, the derivative may be prepared, for example, by converting one equivalent of an N-hydroxymethyl(meth)acrylamide compound and one equivalent of a compound R$^3$OH into an ether of R$^3$ and (meth) acrylamide methyl by dehydration.

When the (meth)acrylamide derivative having the specific structure is, for example, a derivative having in the molecule thereof a single (meth)acrylamide group, the derivative may be prepared, for example, by converting one equivalent of an N-hydroxymethyl(meth)acrylamide compound and one equivalent of a polyalkylene glycol compound into mono (meth)acrylamide methyl ether of polyalkylene glycol by dehydration.

The polyalkylene glycol compound may be used in the form of a monoalkyl ether thereof. In the case of using a monoalkyl ether of the polyalkylene glycol compound, the alkyl group in the compound is preferably, for example, an alkyl group having 1 to 20 carbon atoms. The alkyl group may have a substituent. Specific examples of the polyalkylene glycol compound include polyethylene glycol, polyethylene glycol monomethyl ether, polyethylene glycol monoethyl ether, and the like.

Instead of the N-hydroxymethyl(meth)acrylamide compound, an N-hydroxymethyl-N-alkyl(meth)acrylamide compound represented by the following formula (II) may be used:

$$CH_2=CHCON(R^2)-CH_2OH \quad (II).$$

The alkyl group $R^2$ is preferably, for example, an alkyl group having 1 to 20 carbon atoms. The alkyl group $R^2$ may have a substituent, and $R^2$ may have a hydroxyl group. When $R^2$ has a hydroxyl group, a compound having a single polyalkylene glycol chain is obtained by using one equivalent of the polyalkylene glycol compound per one equivalent of the (meth) acrylamide compound (II). When $R^2$ has a hydroxyl group, a compound having two polyalkylene glycol chains is obtained by using two equivalents of the polyalkylene glycol compound per one equivalent of the (meth)acrylamide compound (II).

The (meth)acrylamide derivative having the specific structure which has in the molecule thereof two (meth)acrylamide groups can be prepared, for example, by converting two equivalents of an N-hydroxymethyl(meth)acrylamide compound and one equivalent of a polyalkylene glycol compound into a bis(meth)acrylamide methyl ether of polyalkylene glycol by dehydration. As the N-hydroxymethyl(meth)acrylamide compound, for example, the same as in the case of the above-mentioned compound having in the molecule thereof a single (meth)acrylamide group may be used. Instead of the N-hydroxymethyl(meth)acrylamide compound, the same N-hydroxymethyl-N-alkyl(meth)acrylamide compound (II) as described above may be used.

The (meth)acrylamide derivative having the specific structure which has in the molecule thereof three or more (meth) acrylamide groups can be prepared, for example, by synthesizing a polyethylene oxide adduct of a polyol compound such as glycerol, erythritol or dipentaerythritol in advance, and then converting this adduct and an N-hydroxymethyl (meth)acrylamide compound into the corresponding (meth) acrylamide methyl ether by dehydration.

In the present invention, in the case of making the refractive index of the organometallic matrix high and making the refractive index of the organic polymer low, it is preferred to use, out of the (meth)acrylamide derivatives having the specific structure, a derivative having no aromatic group to give a low refractive index (for example, a refractive index of 1.5 or less).

In the present invention, it is allowable to use, as the radical photopolymerizable compound, a radical polymerizable compound other than the (meth)acrylamide derivative having the specific structure, such as a (meth)acrylic acid ester monomer or a vinyl monomer, together with the derivative.

When the other radical photopolymerizable compound is used together, the (meth)acrylamide derivative having the specific structure, which is represented by the general formula (I), is used to set the number of radical polymerizable C=C double bonds having a structure of [$CH_2=CR^1-CONR^2-CH_2-O-$] to at least 30% with respect to the total number of radical polymerizable C=C double bonds in all radical photopolymerizable compounds contained in the hologram recording material, preferably at least 40%, and even more preferably at least 50%. Further, the derivative may be used to set the number of radical polymerizable C=C double bonds having the structure of [$CH_2=CR^1-CONR^2-CH_2-O-$] to at least 70%, at least 80%, or at least 90%. Of course, it is also preferred to use the (meth)acrylamide derivative having the specific structure alone.

In order not to damage the purpose of the present invention that the increase in the free volume based on the cleavage reaction compensates for the polymerization shrinkage (recording shrinkage), it is preferred to use the (meth)acrylamide derivative having the specific structure in an amount within the above-mentioned range. When the organic group(s) $R^2$ and/or $R^3$ have/has therein a structure of [$CH_2=CR^1-CONR^1-CH_2-O-$] wherein R' represents H or an organic group, the number of radical polymerizable C=C double bonds resulting from this structure is also counted, since the group(s) $R^2$ and/or $R^3$ contribute(s) to the increase in the free volume based on the cleavage reaction. Considering the degree of the increase in the free volume based on the (meth)acrylamide derivative having the specific structure, it is advisable that when the other radical photopolymerizable compound is used together, the use amount thereof should be decided.

Examples of the (meth)acrylic acid ester monomer used together with the derivative include monofunctional (meth) acrylates such as phenoxyethyl(meth)acrylate, 2-methoxyethyl(meth)acrylate, 2-hydroxyethyl(meth)acrylate, benzyl (meth)acrylate, cyclohexyl(meth)acrylate, ethoxydiethylene glycol(meth)acrylate, methoxypolyethylene glycol(meth) acrylate, methyl(meth)acrylate, polyethylene glycol(meth) acrylate, polypropylene glycol(meth)acrylate, and stearyl (meth)acrylate; and polyfunctional (meth)acrylates such as trimethylolpropane tri(meth)acrylate, pentaerythritol tetra(meth)acrylate, dipentaerythritol hexa(meth)acrylate, diethylene glycol di(meth) acrylate, triethylene glycol di(meth)acrylate, tetraethylene glycol di(meth)acrylate, polyethylene glycol di(meth)acrylate, bis(2-hydroxyethyl)isocyanurate di(meth)acrylate, and 2,2-bis[4-(acryloxy-diethoxy)phenyl]propane.

Examples of the vinyl monomer include monofunctional vinyl compounds such as monovinylbenzene(styrene), and ethylene glycol monovinyl ether; and polyfunctional vinyl compounds such as divinylbenzene, ethylene glycol divinyl ether, diethylene glycol divinyl ether, and triethylene glycol divinyl ether. However, the vinyl monomer is not necessarily limited thereto.

One kind of the other radical photopolymerizable compound may be used, and two or more kinds thereof are used together. In the case of making the refractive index of the organometallic matrix high and making the refractive index of the organic polymer low, in the present invention, a compound having no aromatic group to give a low refractive index (for example, refractive index of 1.5 or less) is preferred out of the above-mentioned radical polymerizable compounds. In order to make the compatibility with the organometallic matrix better, preferred is a more hydrophilic glycol derivative such as polyethylene glycol(meth)acrylate and polyethylene glycol di(meth)acrylate.

It is advisable that in the present invention the radical photopolymerizable compound is used in total, for example, in an amount of about 5 to 1,000% by weight of total (as a nonvolatile component) of the organometallic matrix, preferably in an amount of 10 to 300% by weight thereof. If the amount of the photopolymerizable compound is less than 5% by weight, a large refractive index change is not easily obtained at the time of recording. If the amount of the photopolymerizable compound is more than 1,000% by weight, a large refractive index change is not easily obtained, either, at the time of recording.

In the present invention, the hologram recording material further contains a photopolymerization initiator corresponding to the wavelength of recording light. When the photopolymerization initiator is contained in the hologram recording material, the polymerization of the photopolymerizable compound is promoted by the light exposure at the time of recording. Consequently, a higher sensitivity is achieved.

In the present invention, since a radical photopolymerizable compound is used, a radical photoinitiator is used. Examples of the radical photoinitiator include Darocure 1173, Irgacure 784, Irgacure 651, Irgacure 184 and Irgacure 907 (each manufactured by Ciba Specialty Chemicals Inc.). The content of the radical photoinitiator is, for example, about 0.1 to 10% by weight, preferably about 0.5 to 5% by weight on the basis of the photopolymerizable compound.

The hologram recording material may contain a dye that functions as a photosensitizer corresponding to the wavelength of recording light or the like besides the photopolymerization initiator. Examples of the photosensitizer include thioxanthones such as thioxanthen-9-one, and 2,4-diethyl-9H-thioxanthen-9-one; xanthenes; cyanines; melocyanines; thiazines; acridines; anthraquinones; and squaliriums. It is advisable to set an amount to be used of the photosensitizer into the range of about 5 to 50% by weight of the radical photoinitiator, for example, about 10% by weight thereof.

A plasticizer may be incorporated into the hologram recording material, the plasticizer being a plasticizer which does not participate in the three-dimensionally crosslinked structure of the matrix and does not contribute to the polymerization reaction caused by recording or reproducing light. If the rigidity of the matrix becomes too high, the radical photopolymerizable monomer does not easily migrate when the hologram recording material undergoes light exposure for recording. On the other hand, if the rigidity of the matrix becomes too low, the stability over time of signals recorded therein is declined. Accordingly, in order to keep the migration of the radical photopolymerizable monomer certainly while the three-dimensionally crosslinked structure of the matrix is maintained at a desired level, a plasticizer component high in fluidity may be incorporated into the material. The addition of the plasticizer component also gives an improvement in the compatibility between the matrix and the radical photopolymerizable monomer. Examples of the plasticizer component include dimethylsiloxane, phenylmethylsiloxane, long-chain alkyl esters, polyethylene glycol, alkyl ethers of polyethylene glycol, polypropylene glycol, alkyl ethers of polypropylene glycol, and a polyethylene glycol/polypropylene glycol (random or block) copolymer.

A process for producing the hologram recording material will be described in the following.

The organometallic matrix may be prepared by causing a metal alkoxide compound and/or an oligomer thereof to undergo hydrolysis and a polymerization reaction (the so-called sol-gel reaction).

The hydrolysis and polymerization reaction may be conducted by the same operation under the same conditions as in known sol-gel methods. For example, the reaction may be conducted by dissolving the predetermined amount of metal alkoxide compound starting material(s) into a preferred organic solvent to prepare a homogenous solution, adding an appropriate acid catalyst dropwise to the solution, and stirring the solution in the presence of water. The amount of the solvent is not limited, and is preferably 10 to 1,000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis and polymerization reaction, which depends on the reactivity of the metal alkoxide compound, may be conducted, in general, at room temperature (about 20 to 30° C.) for 0.5 hour or more and 5 hours or less, preferably 0.5 hour or more and 3 hours or less. The reaction may be conducted in the atmosphere of an inert gas such as a nitrogen gas, or may be conducted under a reduced pressure of about 0.5 to 1 atm while an alcohol generated by the polymerization reaction is removed.

In the present invention, it is preferred that before the hydrolysis of an alkoxide compound of a metal other than Si, which has been previously described, an organic polydentate ligand is coordinated to the alkoxide compound of the other metal.

The polydentate ligand is the so-called chelate ligand, and examples thereof include β-dicarbonyl compounds, polyhydroxylated ligands, α- or β-hydroxyacids, and ethanolamines. Examples of the β-dicarbonyl compounds include β-diketones such as acetylacetone (AcAc) and benzoylacetone, and β-ketoesters such as ethyl acetoacetate (EtAcAc). Examples of the polyhydroxylated ligands include glycols (in particular 1,3-diol type glycols such as 1,3-propanediol, and 2-ethyl-1,3-hexanediol). Examples of the α- or β-hydroxyacids include lactic acid, glyceric acid, tartaric acid, citric acid, tropic acid, and benzilic acid. Other examples of the ligand include oxalic acid.

An aromatic carboxylic acid is also preferred as the ligand. Any aromatic carboxylic acid is a compound wherein one or more carboxyl groups (—COOH) are bonded directly to an aromatic ring (Ar). Examples of the aromatic carboxylic acid include aromatic monocarboxylic acids such as benzoic acid, o-, m- or p-toluic acids, and o-, m- or p-methoxybenzoic acids; and aromatic dicarboxylic acids such as phthalic acid, and terephthalic acid.

When the alkoxide compound of a metal (such as Ti, Zr, Ta, Sn, Al or Zn) other than Si is caused to undergo a so-gel reaction, the rate of the hydrolysis and polymerization reaction thereof is generally large; therefore, a produced oxide of the metal may aggregate depending on conditions for the reaction. Thus, by coordinating an organic ligand thereto, the rate of the hydrolysis and polymerization reaction can be restrained. As a result, a more homogeneous sol-gel reaction product is obtained.

Further, when the organic ligand is coordinated to the alkoxide compound of a metal other than Si, an organic group is introduced to the resultant composite metal compound fine particles. The introduction of the organic group gives a further improvement in the compatibility between the composite metal compound fine particles matrix and the photopolymerizable compound.

Before, during or after the hydrolysis, the radical photopolymerizable organic compound is mixed. The photopolymerizable organic compound may be mixed with the metal alkoxide compounds after, during or before the hydrolysis. In the case of the mixing after the hydrolysis, it is preferred to add and mix the photopolymerizable organic compound in the state that the sol-gel reaction system containing the organometallic compound or the precursor thereof is sol in order to perform the mixing uniformly. The mixing of a radical photopolymerization initiator or photosensitizer can also be conducted before, during or after the hydrolysis.

The polycondensation reaction of the organometallic compound precursor, with which the photopolymerizable compound is mixed, is advanced to yield a hologram recording material liquid wherein the photopolymerizable compound is uniformly incorporated in an organometallic compound fine particles matrix in a sol-form. The hologram recording material liquid is applied onto a substrate, and then drying of the solvent and a sol-gel reaction are further advanced, thereby yielding a hologram recording material layer in a film form.

In such a way, the hologram recording material layer is produced wherein the radical photopolymerizable compound is uniformly contained in an organometallic matrix.

The hologram recording medium of the present invention comprises at least the above-mentioned hologram recording material layer. Usually, a hologram recording medium comprises a supporting substrate (i.e., a substrate) and a hologram recording material layer; however, a hologram recording medium may be made only of a hologram recording material layer without having any supporting substrate. For example, a medium composed only of a hologram recording material layer may be obtained by forming the hologram recording material layer onto a substrate by application, and then peeling the hologram recording material layer off from the substrate. In this case, the hologram recording material layer is, for example, a layer having a thickness in the order of millimeters.

The hologram recording medium is either of a medium having a structure for performing reproduction using transmitted light (hereinafter referred to as a transmitted light reproducing type medium), and a medium having a structure for performing reproduction using reflected light (hereinafter referred to as a reflected light reproducing type medium) in accordance with an optical system used for the medium.

The hologram recording medium of the present invention is suitable for record and reproduction using not only a green laser light but also a blue laser light having a wavelength of 350 to 450 nm. When the reproduction is made using transmitted light, the medium preferably has a light transmittance of 50% or more at a wavelength of 405 nm. When the reproduction is made using reflected light, the medium preferably has a light reflectance of 25% or more at a wavelength of 405 nm.

When the above described hologram recording material is used, a hologram recording medium having a recording layer thickness of 100 μm or more, which is suitable for data storage, can be obtained. The hologram recording medium can be produced by forming the hologram recording material in a film form onto a substrate, or sandwiching the hologram recording material in a film form between substrates.

In a transmitted light reproducing type medium, it is preferred to use, for the substrate(s), a material transparent to a recording/reproducing wavelength, such as glass or resin. It is preferred to form an anti-reflection film against the recording/reproducing wavelength for preventing noises, or give address signals and so on, onto the substrate surface at the side opposite to the layer of the hologram recording material. In order to prevent interface reflection, which results in noises, it is preferred that the refractive index of the hologram recording material and that of the substrate are substantially equal to each other. It is allowable to form, between the hologram recording material layer and the substrate, a refractive index adjusting layer comprising a resin material or oil material having a refractive index substantially equal to that of the recording material or the substrate. In order to keep the thickness of the hologram recording material layer between the substrates, a spacer suitable for the thickness between the substrates may be arranged. End faces of the recording material medium are preferably subjected to treatment for sealing the recording material.

About the reflected light reproducing type medium, it is preferred that the substrate positioned at the medium surface side into which a reproducing laser light is incident is made of a material transparent to a recording and reproducing wavelength, such as glass or resin. As the substrate positioned at the medium surface side opposite to the medium surface side into which a reproducing laser light is incident, a substrate having thereon a reflective film is used. Specifically, a reflective film made of, for example, Al, Ag, Au or an alloy made mainly of these metals and the like is formed on a surface of a rigid substrate (which is not required to have a light-transmitting property), such as glass or resin, by vapor deposition, sputtering, ion plating, or any other film-forming method, whereby a substrate having thereon the reflective film is obtained. A hologram recording material layer is provided so as to have a predetermined thickness on the surface of the reflective film of this substrate, and further a light-transmitting substrate is caused to adhere onto the surface of this recording material layer. An adhesive layer, a flattening layer and the like may be provided between the hologram recording material layer and the reflective film, and/or between the hologram recording material layer and the light-transmitting substrate. It is also unallowable that these optional layers hinder the transmission of the laser light. Others than this matter are the same as in the above-mentioned transmitted light reproducing type medium.

About the hologram recording material used for data storage, the recording shrinkage ratio, a larger positive value of which means a larger shrinkage, is set preferably to 0.5% or less, more preferably to 0.3% or less, even more preferably to 0.2% or less when the hologram recording material undergoes exposure to light for hologram recording and/or postcure (postcuring). It is most preferable that the hologram recording material does not shrink.

The hologram recording medium which has the hologram recording layer comprising the hologram recording material of the present invention can be preferably used not only in a system wherein record and reproduction are made using a green laser light but also in a system wherein record and reproduction are made using a blue laser light having a wavelength of 350 to 450 nm.

EXAMPLES

The present invention will be specifically described by way of the following examples; however, the invention is not limited to the examples.

Example 1

Synthesis of an Acrylamide Derivative Monomer

From N-(hydroxymethyl)acrylamide and polyethylene glycol monomethyl ether, a target compound (a) of monoacrylamidemethyl ether-monomethyl ether of polyethylene glycol represented by the following formula was synthesized in accordance with a method described in JP-A-2006-225446:

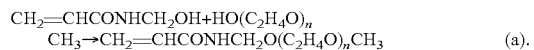

$$CH_2\!=\!CHCONHCH_2OH + HO(C_2H_4O)_n$$
$$CH_3 \rightarrow CH_2\!=\!CHCONHCH_2O(C_2H_4O)_nCH_3 \qquad (a).$$

A mixed solution of 100 parts by weight of N-(hydroxymethyl)acrylamide (manufactured by Wako Pure Chemical Industries, Ltd.), 266 parts by weight of polyethylene glycol monomethyl ether (manufactured by Alfa Aesar Co. in UK, weight-average molecular weight Mw=350), 0.3 part by weight of p-toluenesulfonic acid, and 0.2 part by weight of hydroquinone was heated to 60° C. in the flow of nitrogen gas, and then was reacted for 10 hours. Next, the volatile components were distilled off at 40° C. under reduced pressure. Thereafter, an unreacted fraction of N-(hydroxymethyl)acrylamide was removed by preparative liquid chromatography, so as to isolate a product. The isolated product was dried under reduced pressure to obtain the target compound (a). The structure of the compound was identified by $^1$H-NMR.
(Synthesis of Matrix Material)

To 2.72 g of tetra-n-butoxytitanium (trade name: B-1, manufactured by Nippon Soda Co., Ltd.) were added 0.49 g of n-butyl alcohol and 0.95 g of 2-methyl-2,4-dihydroxypentane, and the resultant was stirred at room temperature to prepare 4.16 g of a solution of a titanium compound wherein two molecules of 2-methyl-2,4-dihydroxypentane were coordinated to one molecule of tetra-n-butoxytitanium.

To this titanium compound solution were added 2.05 g of diphenyldimethoxysilane (trade name: LS-5300, manufactured by Shin-Etsu Chemical Co., Ltd.) and 0.51 g of a 50% by weight solution of N-(3-triethoxysilylpropyl)gluconamide (trade name: SIT8189.0, manufactured by Azmax Co., Ltd.) in ethanol to prepare a metal alkoxide solution. The mole ratio of Ti/Si was 0.8/1.

A solution composed of 0.15 g of pure water, 0.06 g of 2 N hydrochloric acid, and 1.49 g of ethanol was dropwise added to the metal alkoxide solution at room temperature while the alkoxide solution was stirred. The stirring was continued for 2 hours to conduct hydrolysis and a condensation reaction. The proportion of the metal alkoxide starting material in the whole of the reaction solution was 64% by weight. In this way, an organometallic sol solution was yielded.
(Photopolymerizable Compound)

To 100 parts by weight of monoacrylamidemethyl ether-monomethyl ether of polyethylene glycol (a) which was synthesized in the above-mentioned step as a photopolymerizable compound, were added 3 parts by weight of a photopolymerization initiator IRGACURE-907 (IRG-907, manufactured by Ciba Specialty Chemicals K.K.), and 0.3 part by weight of thioxanthen-9-one as a photosensitizer, so as to prepare a mixture containing the photopolymerizable compound.
(Hologram Recording Material Solution)

The sol solution and the mixture containing the photopolymerizable compound were mixed with each other at a room temperature to set the ratio of the matrix material (as a nonvolatile component with respect to the starting material) and that of the photopolymerizable compound to 85 parts by weight and 15 parts by weight respectively, to obtain a hologram recording material solution substantially transparent and colorless.
(Hologram Recording Material)

With reference to FIG. 1, which schematically illustrates a cross section of a hologram recording medium, explanation will be described.

A glass substrate (22) having a thickness of 1 mm and having one surface on which an anti-reflection film (22a) was formed was prepared. A spacer (24) having a predetermined thickness was put on a surface of the glass substrate (22) on which the anti-reflection film (22a) was not formed, and the hologram recording material solution obtained was applied onto the surface of the glass substrate (22). The resultant was dried at a room temperature for 1 hour, and then dried at 40° C. for 48 hours to volatilize the solvent. Through this drying step, the gelation (condensation reaction) of the organometallic compound was advanced so as to yield a hologram recording material layer (21) having a dry film thickness of 450 μm wherein the organometallic compound and the photopolymerizable compound were uniformly dispersed.
(Hologram Recording Medium)

The hologram recording material layer (21) formed on the glass substrate (22) was covered with another glass substrate (23) having a thickness of 1 mm and having one surface on which an anti-reflection film (23a) was formed. At this time, the covering was carried out in such a manner that a surface of the glass substrate (23) on which the anti-reflection film (23a) was not formed would not contact the surface of the hologram recording material layer (21). In this way, a hologram recording medium (11) was obtained which had a structure wherein the hologram recording material layer (21) was sandwiched between the two glass substrates (22) and (23).
(Evaluation of Properties)

Figure 2:
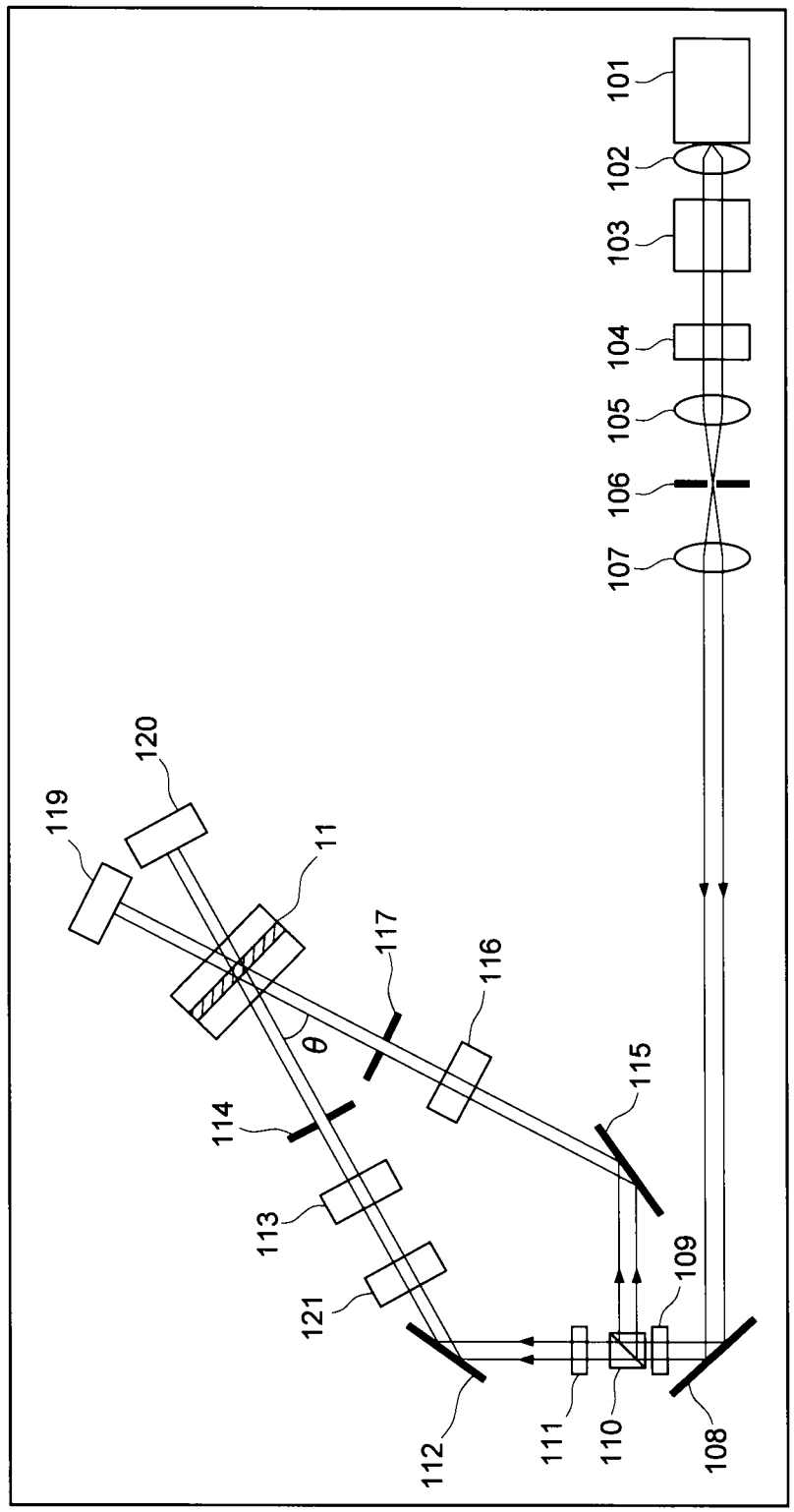
FIG. 2 is a plane view illustrating the outline of a hologram recording optical system used in the examples.

About the resultant hologram recording medium sample of Example 1, properties thereof were evaluated in a hologram recording optical system as illustrated in FIG. 2. The direction along which the paper surface on which FIG. 2 is drawn stretches is defined as a horizontal direction for convenience' sake.

In FIG. 2, the hologram recording medium sample (11) was set to make the recording material layer perpendicular to the horizontal direction.

In the hologram recording optical system illustrated in FIG. 2, a light source (101) for emitting a semiconductor laser (wavelength: 405 nm) in a single mode oscillation was used. Light emitted from this light source (101) was subjected to a spatial filtrating treatment by means of a beam shape adjuster (102), a light isolator (103), a shutter (104), a convex lens (105), a pinhole (106), and a convex lens (107), so as to be collimated, thereby enlarging the light into a beam diameter of about 10 mmϕ. The enlarged beam was passed through a mirror (108) and a ½ wavelength plate (109) to take out 45° (45 degree) polarized light. The light was split into an S wave and a P wave (the ratio of S wave/P wave is 1/1) through a polarized beam splitter (110). The S wave obtained by the splitting was passed through a mirror (115), a polarizing filter (116), and an iris diaphragm (117) while a ½ wavelength plate (111) was used to convert the P wave obtained by the splitting to an S wave and then the S wave was passed through a mirror (112), a polarizing filter (113) and an iris diaphragm (114). In this way, the total incident angle θ of the two beams of light irradiated into the hologram recording medium sample (11) was set to 37°, so as to record interference fringes of the two beams of light in the sample (11).

The sample (11) was rotated in the horizontal direction to attain multiplexing (angle multiplexing; sample angle: −21° to +21°, angle interval: 0.6°), thereby attaining hologram recording. The multiplicity was 71. At the time of recording, the sample was exposed to the light while the iris diaphragms (114) and (117) were each set to a diameter of 4 mm. At a position where the angle of the surfaces of the sample (11) to the bisector (not illustrated) of the angle θ made by the two beams of light was 90°, the above-mentioned sample angle was set to ±0°.

After the hologram recording, in order to react remaining unreacted components, a sufficient quantity of blue light having a wavelength of 400 nm was irradiated to the whole of the surface of the sample (11) from a blue LED. At this time, the light was irradiated through an acrylic resin diffuser plate having a light transmittance of 80% so as to cause the irradiated light not to have coherency (the light irradiation is called postcure). At the time of reproduction, with shading by the shutter (121), the iris diaphragm (117) was set into a diameter of 1 mm and only one beam of light was irradiated. The sample (11) was continuously rotated into the horizontal direction from −23° to +23°. In the individual angle positions, the diffraction efficiency was measured with a power meter (120). When a change in the volume (a recording shrinkage) or a change in the average refractive index of the recording material layer is not generated before and after the recording, the diffraction peak angle in the horizontal direction at the time of the recording is consistent with that at the time of the reproduction. Actually, however, a recording shrinkage or a change in the average refractive index is generated; therefore, the diffraction peak angle in the horizontal direction at the time of the reproduction is slightly different from the diffraction peak angle in the horizontal direction at the time of the recording. For this reason, at the time of the reproduction, the angle in the horizontal direction was continuously changed and then the diffraction efficiency was calculated from the peak intensity when a diffraction peak made its appearance. In FIG. 2, reference number (119) represents a power meter not used in this example.

At this time, a dynamic range M/# (the sum of the square roots of the diffraction efficiencies) was a high value of 35.1, which was a converted value corresponding to the case that the thickness of the hologram recording material layer was converted to 1 mm.

(Measurement of Recording Shrinkage Ratio)

The same optical system as used in the property evaluation was used to conduct angle multiplex recording. However, at the time of the recording, the sample angle was set into the range of −21° to +21°, and the angle interval was set to 3.0°. Namely, the multiplicity was 15. Conditions for the exposure to light were adjusted to make each diffraction peak intensity when the recorded data were reproduced into a value close to 1%.

Postcure was conducted in the same manner as described above, and the recorded data were reproduced in the same manner as in the property evaluation. The angle deviation amount from the recording angle at each of the diffraction peaks was measured. On the supposition that this angle deviation was entirely generated from shrinkage of the recording layer in the thickness direction thereof, the ratio of the recording shrinkage was estimated. The estimation was in accordance with a method disclosed in Lisa Dhar et al., Applied Physics Letters Vol. 73 (No. 10), 1998, pp. 1337-1339.

As a result, it was verified that the recording shrinkage ratio of the present recording medium sample, a larger positive value of which means a larger shrinkage, was restrained into a very low value of 0.1%.

Example 2

A hologram recording material solution and a hologram recording medium were obtained in the same manner as in Example 1 except that instead of the above 100 parts by weight of monoacrylamidemethyl ether-monomethyl ether of polyethylene glycol (a), a mixture of 90 parts by weight of the compound (a) and 10 parts by weight of methoxypolyethylene glycol acrylate (trade name: LIGHT ACRYLATE 130A, manufactured by Kyoeisha Chemical Co., Ltd.) was used as a photopolymerizable compound.

About the resultant hologram recording medium sample, angle multiplex recording was conducted for property evaluation in the same manner as in Example 1. As a result, the dynamic range: M/# was 34.9, which was a converted value corresponding to the case that the thickness of the hologram recording material layer was converted to 1 mm.

In the same manner as in Example 1, the recording shrinkage ratio was measured. As a result, the ratio was 0.1%.

Example 3

A hologram recording material solution and a hologram recording medium were obtained in the same manner as in Example 1 except that instead of the above 100 parts by weight of monoacrylamidemethyl ether-monomethyl ether of polyethylene glycol (a), a mixture of 70 parts by weight of the compound (a) and 30 parts by weight of methoxypolyethylene glycol acrylate (trade name: LIGHT ACRYLATE 130A, manufactured by Kyoeisha Chemical Co., Ltd.) was used as a photopolymerizable compound.

About the resultant hologram recording medium sample, angle multiplex recording was conducted for property evaluation in the same manner as in Example 1. As a result, the dynamic range: M/# was 37.0, which was a converted value corresponding to the case that the thickness of the hologram recording material layer was converted to 1 mm.

In the same manner as in Example 1, the recording shrinkage ratio was measured. As a result, the ratio was 0.14%.

Comparative Example 1

A hologram recording material solution and a hologram recording medium were obtained in the same manner as in Example 1 except that instead of the above 100 parts by weight of monoacrylamidemethyl ether-monomethyl ether of polyethylene glycol (a), 100 parts by weight of methoxypolyethylene glycol acrylate (trade name: LIGHT ACRYLATE 130A, manufactured by Kyoeisha Chemical Co., Ltd.) were used as a photopolymerizable compound.

About the resultant hologram recording medium sample, angle multiplex recording was conducted for property evaluation in the same manner as in Example 1. As a result, the dynamic range: M/# was 37.9, which was a converted value corresponding to the case that the thickness of the hologram recording material layer was converted to 1 mm.

In the same manner as in Example 1, the recording shrinkage ratio was measured. As a result, the ratio was a high value of 0.6%.

Comparative Example 2

Synthesis of an Acrylamide Derivative Monomer

From N-(hydroxyethyl)acrylamide (manufactured by Tokyo Chemical Industry Co., Ltd.) and polyethylene glycol monomethyl ether (manufactured by Alfa Aesar Co. in UK, weight-average molecular weight Mw=350), a target compound (b) of monoacrylamideethyl ether-monomethyl ether of polyethylene glycol represented by the following formula was synthesized in the same manner as in Example 1. The compound (b) is a compound excluded from the (meth)acrylamide derivative represented by the general formula (I) used in the present invention.

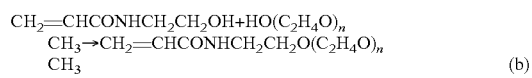

(b)

A hologram recording material solution and a hologram recording medium were obtained in the same manner as in Example 1 except that instead of the above 100 parts by weight of monoacrylamidemethyl ether-monomethyl ether of polyethylene glycol (a), 100 parts by weight of the synthesized compound (b) were used as a photopolymerizable compound.

About the resultant hologram recording medium sample, angle multiplex recording was conducted for property evaluation in the same manner as in Example 1. As a result, the dynamic range: M/# was 36.8, which was a converted value corresponding to the case that the thickness of the hologram recording material layer was converted to 1 mm.

In the same manner as in Example 1, the recording shrinkage ratio was measured. As a result, the ratio was a high value of 0.5%.

Molecular weight (Mw) of photopolymerizable monomer used in each example or each comparative example is as follows:

Mw of the acrylamide derivative (a): 432
Mw of the acrylamide derivative (b): 446
Mw of LIGHT ACRYLATE 130A: 483.

The ratio of the number of radical polymerizable C=C double bonds present in each monomer, with respect to the total number of radical polymerizable C=C double bonds present in the whole of the photopolymerizable monomer(s), is as shown in Table 1.

The results are shown in Table 1. Each recording shrinkage ratio in Examples 1 to 3 was restrained very much, respectively, compared with the ratios in Comparative Examples 1 and 2.

TABLE 1

|  |  | Photopolymerizable monomer | | | | |
| --- | --- | --- | --- | --- | --- | --- |
|  |  | Acrylamide derivative (a) | Acrylamide derivative (b) | LIGHT ACRYLATE 130A | M/# | Recording shrinkage ratio (%) |
| Example 1 | Weight ratio | 100 | — | — | 35.1 | 0.1 |
|  | Ratio of number of C=C bonds | 100 | — | — |  |  |
| Example 2 | Weight ratio | 90 | — | 10 | 34.9 | 0.1 |
|  | Ratio of number of C=C bonds | 91 | — | 9 |  |  |
| Example 3 | Weight ratio | 70 | — | 30 | 37.0 | 0.14 |
|  | Ratio of number of C=C bonds | 72 | — | 28 |  |  |
| Comparative Example 1 | Weight ratio | — | — | 100 | 37.9 | 0.6 |
|  | Ratio of number of C=C bonds | — | — | 100 |  |  |
| Comparative Example 2 | Weight ratio | — | 100 | — | 36.8 | 0.5 |
|  | Ratio of number of C=C bonds | — | 100 | — |  |  |

What is claimed is:

1. A hologram recording material comprising:
a radical photopolymerizable compound; and
a matrix which is a dispersion medium for the radical photopolymerizable compound,
wherein the radical photopolymerizable compound comprises a (meth)acrylamide derivative represented by formula (I):

$$CH_2=CR^1-CONR^2-CH_2-O-R^3 \quad (I)$$

wherein $R^1$ represents H, $R^2$ represents H, and $R^3$ represents an organic group having 3 or more carbon atoms in total, and $R^3$ has a polyethylene glycol unit represented by formula:

$$-(CH_2CH_2O)_n-$$

where n represents a number of repeating units of ethylene oxide,
wherein the (meth)acrylamide derivative represented by the formula (I) causes a cleavage reaction to yield a molecule $CH_2=CR^1-CONR^2CH_2OH$ and a molecule $HOR^3$ at a time of light exposure for hologram recording and/or postcure, thereby increasing a free volume,
wherein the matrix is an organometallic matrix formed from a matrix-forming material comprising at least one of a metal alkoxide compound and an oligomer thereof.

2. The hologram recording material according to claim 1, wherein a number of radical polymerizable C=C double bonds having a structure of $CH_2=CR^1-CONR^2-CH_2-O-$ in the (meth)acrylamide derivative represented by the formula (I) is at least 30% with respect to a total number of radical polymerizable C=C double bonds in the radical photopolymerizable compound in the hologram recording material.

3. The hologram recording material according to claim 1, which further comprises a photopolymerization initiator.

4. The hologram recording material according to claim 1, wherein the matrix-forming material comprises at least one of a Si alkoxide compound and an oligomer thereof.

5. The hologram recording material according to claim 1, wherein the matrix-forming material comprises:
at least one of a Si alkoxide compound and an oligomer thereof; and
at least one of a metal alkoxide compound and an oligomer of the metal alkoxide compound, where the metal alkoxide compound is at least one metal alkoxide compound selected from the group consisting of a Ti alkoxide compound, a Zr alkoxide compound, a Ta alkoxide compound, a Sn alkoxide compound, a Zn alkoxide compound, and an Al alkoxide compound.

6. A hologram recording medium comprising a hologram recording layer comprising the hologram recording material according to claim 1.

7. The hologram recording material according to claim 1, wherein the (meth)acrylamide derivative of the formula (I) is a product of a reaction between an N-hydroxymethyl(meth)acrylamide and a polyalkylene glycol monoalkyl ether.

8. The hologram recording material according to claim 1, wherein the radical photopolymerizable compound is a mixture of the (meth)acrylamide derivative represented by the formula (I) and methoxypolyethylene glycol acrylate, and a number of radical polymerizable C=C double bonds having a structure of $CH_2=CR^1-CONR^2-CH_2-O-$ is at least 70% with respect to a total number of radical polymerizable C=C double bonds in the radical photopolymerizable compound.

9. A hologram recording material comprising:
a radical photopolymerizable compound; and
a matrix which is a dispersion medium for the radical photopolymerizable compound, the matrix comprising an organometallic compound,
wherein the radical photopolymerizable compound comprises a (meth)acrylamide derivative represented by formula (I):

$$CH_2=CR^1-CONR^2-CH_2-O-R^3 \quad (I)$$

wherein $R^1$ represents H, $R^2$ represents H, and $R^3$ represents an organic group having 3 or more carbon atoms in total, and $R^3$ has a polyethylene glycol unit represented by formula:

$$-(CH_2CH_2O)_n-$$

where n represents a number of repeating units of ethylene oxide, and the number of the repeating units is 3 or more,
  wherein the (meth)acrylamide derivative represented by the formula (I) causes a cleavage reaction to yield a molecule $CH_2=CR^1-CONR^2CH_2OH$ and a molecule $HOR^3$ at a time of light exposure for hologram recording and/or postcure, thereby increasing a free volume.

10. The hologram recording material according to claim 9, wherein a number of radical polymerizable C=C double bonds having a structure of $CH_2=CR^1-CONR^2-CH_2-O-$ in the (meth)acrylamide derivative represented by the formula (I) is at least 30% with respect to a total number of radical polymerizable C=C double bonds in the radical photopolymerizable compound in the hologram recording material.

11. The hologram recording material according to claim 9, which further comprises a photopolymerization initiator.

12. The hologram recording material according to claim 9, wherein the organometallic matrix is formed from a matrix-forming material comprising at least one of a metal alkoxide compound and an oligomer thereof.

13. The hologram recording material according to claim 12, wherein the matrix-forming material comprises at least one of a Si alkoxide compound and an oligomer thereof.

14. The hologram recording material according to claim 12, wherein the matrix-forming material comprises:
  at least one of a Si alkoxide compound and an oligomer thereof; and
  at least one of a metal alkoxide compound and an oligomer of the metal alkoxide compound, where the metal alkoxide compound is at least one metal alkoxide compound selected from the group consisting of a Ti alkoxide compound, a Zr alkoxide compound, a Ta alkoxide compound, a Sn alkoxide compound, a Zn alkoxide compound, and an Al alkoxide compound.

15. A hologram recording medium comprising:
  a hologram recording layer comprising the hologram recording material according to claim 9.

* * * * *